(12) United States Patent
Aoki et al.

(10) Patent No.: US 12,052,880 B2
(45) Date of Patent: Jul. 30, 2024

(54) DISPLAY DEVICE AND METHOD FOR MANUFACTURING DISPLAY DEVICE

(71) Applicant: Japan Display Inc., Tokyo (JP)

(72) Inventors: Hayata Aoki, Tokyo (JP); Masumi Nishimura, Tokyo (JP); Jun Nitta, Tokyo (JP)

(73) Assignee: Japan Display Inc., Tokyo (JP)

(*) Notice: Subject to any disclaimer, the term of this patent is extended or adjusted under 35 U.S.C. 154(b) by 360 days.

(21) Appl. No.: 17/574,812

(22) Filed: Jan. 13, 2022

(65) Prior Publication Data

US 2022/0231250 A1 Jul. 21, 2022

(30) Foreign Application Priority Data

Jan. 15, 2021 (JP) ................. 2021-005018

(51) Int. Cl.
*H10K 50/12* (2023.01)
*H10K 50/17* (2023.01)
*H10K 71/00* (2023.01)

(52) U.S. Cl.
CPC ............. *H10K 50/12* (2023.02); *H10K 50/17* (2023.02); *H10K 71/00* (2023.02)

(58) Field of Classification Search
CPC ........ H10K 50/12; H10K 50/17; H10K 71/00; H10K 2101/80; H10K 50/11; H10K 50/155; H10K 59/122
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2021/0091158 A1 | 3/2021 | Kasahara |
| 2021/0408488 A1* | 12/2021 | Lu ................ H10K 50/856 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| WO | WO 2019/026511 A1 | 2/2019 |

* cited by examiner

*Primary Examiner* — Mohammad A Rahman
(74) *Attorney, Agent, or Firm* — Maier & Maier, PLLC (57) ABSTRACT

According to one embodiment, a display device includes a lower electrode, a second insulating layer including an opening overlapping the lower electrode, an organic layer including a light-emitting layer and a functional layer, disposed in the opening and covering the lower electrode and an upper electrode covering the organic layer. The functional layer includes a first region located between the lower electrode and the light-emitting layer and a second region including an end surface located directly above the second insulating layer. A dopant concentration of a guest material in the second region is lower than the dopant concentration of the guest material in the first region.

7 Claims, 9 Drawing Sheets

DISPLAY DEVICE AND METHOD FOR MANUFACTURING DISPLAY DEVICE

CROSS-REFERENCE TO RELATED APPLICATIONS

This application is based upon and claims the benefit of priority from Japanese Patent Application No. 2021-005018, filed Jan. 15, 2021, the entire contents of which are incorporated herein by reference.

FIELD

Embodiments described herein relate generally to a display device and to a method of manufacturing the display device.

BACKGROUND

In recent years, display devices in which organic light-emitting diodes (OLEDs) are applied as display elements have been used in practical applications. The display element comprises an organic layer between a pixel electrode and a common electrode. The organic layer includes, in addition to the light-emitting layer, functional layers such as a hole transport layer and an electron transport layer. Such an organic layer is formed, for example, by the vacuum deposition method.

For example, in the case of vapor deposition using mask, a fine mask with openings corresponding to various pixels is applied. However, due to the processing accuracy of the fine mask, deformation of the shape of openings, etc., the accuracy of formation of the thin film formed by vapor deposition may be lowered. For example, when forming an organic layer with multiple functional layers stacked one on another, the edge surface of the organic layer may not be formed at the desired position, resulting in degradation in performance of the display device.

DETAILED DESCRIPTION

In general, according to one embodiment, a display device comprises an insulating substrate, a first insulating layer disposed above the insulating substrate, a lower electrode disposed on the first insulating layer, a second insulating layer disposed on the first insulating layer and comprising an opening overlapping the lower electrode, an organic layer including a light-emitting layer and a functional layer, disposed in the opening and covering the lower electrode and an upper electrode covering the organic layer. The functional layer includes a first region located between the lower electrode and the light-emitting layer and a second region including an end surface located directly above the second insulating layer. A dopant concentration of a guest material in the second region is lower than the dopant concentration of the guest material in the first region.

According to another embodiment, a display device comprises an insulating substrate, a first insulating layer disposed above the insulating substrate, a lower electrode disposed on the first insulating layer, a second insulating layer disposed on the first insulating layer and comprising an opening overlapping the lower electrode, an organic layer including a light-emitting layer, disposed in the opening and covering the lower electrode and an upper electrode covering the organic layer. The light-emitting layer includes a first region located between the lower electrode and the upper electrode and a second region including an end surface located directly above the second insulating layer. A dopant concentration of a light-emitting material in the second region is higher than the dopant concentration of the light-emitting material in the first region.

According to still another embodiment, a method for manufacturing a display device, comprises forming a lower electrode, forming an organic layer on the lower electrode and forming an upper electrode on the organic layer. The forming the organic layer includes forming a functional layer. The forming the functional layer includes co-depositing a host material emitted at a first radiation angle and a guest material emitted at a second radiation angle smaller than the first radiation angle.

According to still another embodiment, a method for manufacturing a display device, comprises forming a lower electrode, forming an organic layer on the lower electrode and forming an upper electrode on the organic layer. The forming the organic layer includes forming a light-emitting layer. The forming the light-emitting layer includes co-depositing a host material emitted at a first radiation angle and a guest material emitted at a second radiation angle greater than the first radiation angle.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane. Further, viewing towards the X-Y plane is referred to as planar view. A direction on the observer side along the third direction is referred to as an upper side, and a surface on the observer side along the third direction is referred to as an upper surface. A direction opposite to the observer along the third direction is referred to as a lower side or a bottom side, and a surface opposite to the observer along the third direction is referred to as a lower surface or a bottom surface.

The display device DSP of this embodiment is an organic electroluminescent display device comprising an organic light-emitting diode (OLED) as a display element, and can be mounted on televisions, personal computers, mobile terminals, cell phones and the like. Note that display element described below can be applied as a light-emitting element of an illumination device, and the display device DSP can be converted to some other electronic device such an illumination device.

Figure 1:
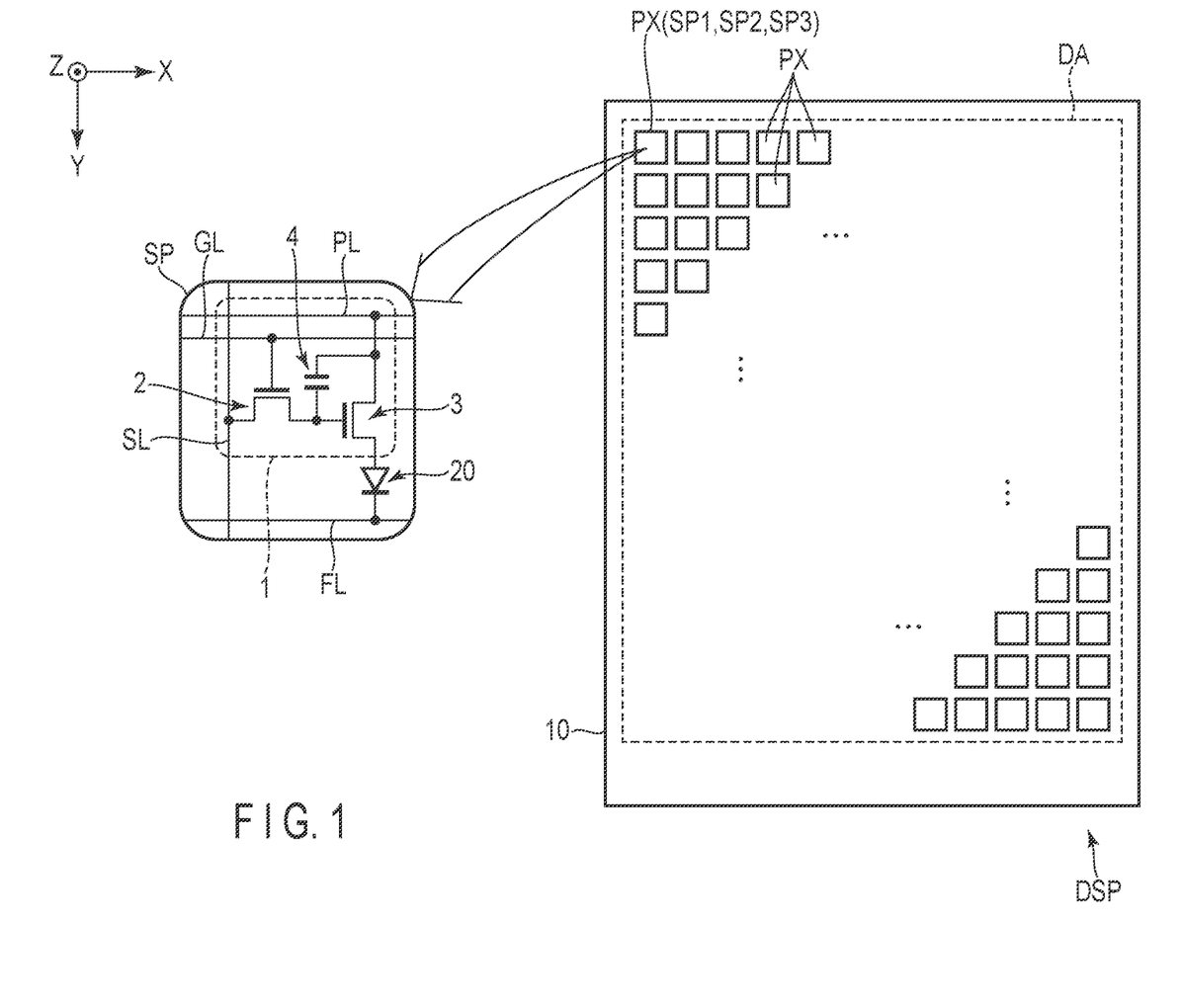
FIG. 1 is a diagram showing a configuration example of a display device DSP according to one embodiment.

FIG. 1 is a diagram showing an example configuration of a display device DSP of this embodiment. The display device DSP comprises a display area DA which displays images, on an insulating base 10. The base 10 is an insulating substrate and may be glass or a flexible resin film.

The display area DA comprises a plurality of pixels PX arranged in a matrix along the first direction X and the second direction Y in the display area DA. The pixels PX each comprises a plurality of subpixels SP1, SP2 and SP3. For example, each pixel PX comprises a red subpixel SP1, a green subpixel SP2 and a blue subpixel SP3. In place of the three subpixels of the three colors, the pixel PX may contain four or more subpixels of other colors, including white.

A configuration example of one subpixel SP contained in a pixel PX will be briefly described.

That is, the subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements constituted by thin-film transistors, for example.

In the pixel switch 2, a gate electrode thereof is connected to a scanning line GL, a source electrode is connected to a signal line SL and a drain electrode is connected to one of the electrodes constituting the capacitor 4 and the gate electrode of the drive transistor 3. In the drive transistor 3, a source electrode thereof is connected to the other electrode of the capacitor 4 and a power line PL, and a drain electrode is connected to an anode of the display element 20. A cathode of the display element 20 is connected to a power feed line FL. Note that the configuration of the pixel circuit 1 is not limited to that of the example shown in the figure.

The display element 20 is an organic light-emitting diode (OLED), which is a light-emitting element. For example, a subpixel SP1 comprises a display element that emits light corresponding to the red wavelength, a subpixel SP2 comprises a display element that emits light corresponding to the green wavelength, and a subpixel SP3 comprises a display element that emits light corresponding to the blue wavelength. The pixel PX comprises multiple subpixels SP1, SP2 and SP3 of display colors different from each other, and with this configuration, multi-color display can be realized.

Note that the display element 20 may be configured so that the subpixels SP1, SP2 and SP3 emit light of the same color. Thus, monochromatic display can be realized.

Here, when the display elements 20 of the subpixels SP1, SP2 and SP3 are configured to emit white light, a color filter may be disposed to oppose the display elements 20. For example, the subpixel SP1 comprises a red color filter opposing the respective display element 20, the subpixel SP2 comprises a green color filter opposing the respective display element 20, and the subpixel SP3 comprises a blue color filter opposing the respective display element 20. With this structure, it is possible to realize multi-color display.

Alternatively, when the display elements 20 of the subpixels SP1, SP2 and SP3 are configured to emit ultraviolet light, a photo conversion layer is provided to oppose the display elements 20, and thus the multi-color display can be realized.

Figure 2:
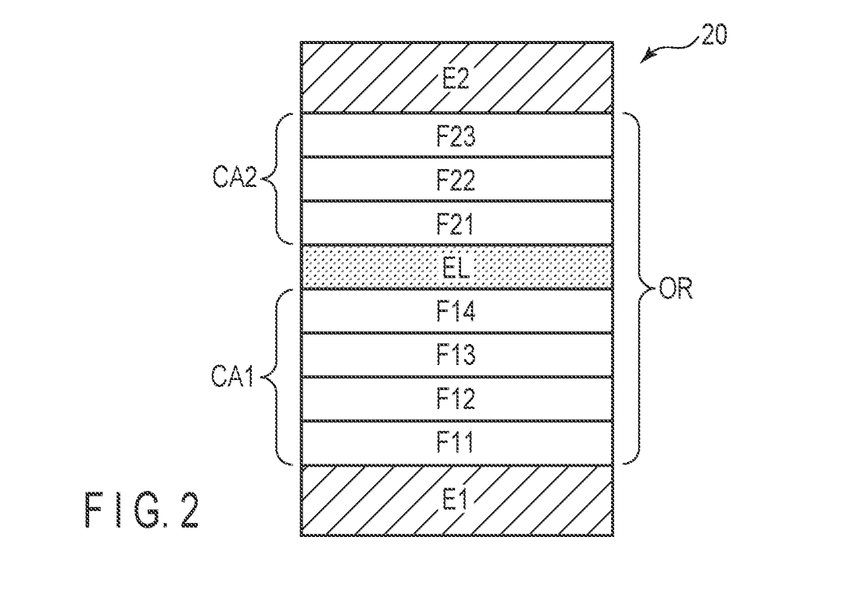
FIG. 2 is a diagram showing an example of a configuration of a display element 20.

FIG. 2 is a diagram showing an example of the configuration of each display element 20.

The display element 20 comprises a lower electrode (first electrode) E1, an organic layer OR and an upper electrode (second electrode) E2. The organic layer OR includes a carrier adjustment layer (first carrier adjustment layer) CA1, a light-emitting layer EL, and a carrier adjustment layer (second carrier adjustment layer) CA2. The carrier adjustment layer CA1 is located between a lower electrode E1 and the light-emitting layer EL, and the carrier adjustment layer CA2 is located between the light-emitting layer EL and an upper electrode E2. The carrier adjustment layers CA1 and CA2 each contain a plurality of functional layers.

Here, the case where the lower electrode E1 corresponds to an anode and the upper electrode E2 corresponds to a cathode will be described as an example.

The carrier adjustment layer CA1 includes a hole injection layer F11, a hole transport layer F12, a carrier generation layer F13, an electron blocking layer F14 and the like, as functional layers. The hole injection layer F11 is disposed on the lower electrode E1, the hole transport layer F12 is disposed on the hole injection layer F11, the carrier generation layer F13 is disposed on the hole transport layer F12, the electron blocking layer F14 is disposed on the carrier generation layer F13, and the light-emitting layer EL is disposed on the electron blocking layer F14.

The carrier adjustment layer CA2 includes a hole blocking layer F21, an electron transport layer F22, an electron injection layer F23 and the like, as functional layers. The hole blocking layer F21 is disposed on the light-emitting layer EL, the electron transport layer F22 is disposed on the hole blocking layer F21, the electron injection layer F23 is disposed on the electron transport layer F22, and the upper electrode E2 is disposed on the electron injection layer F23.

Note that in addition to the functional layers described above, the carrier adjustment layers CA1 and CA2 may include other functional layers as needed, or at least one of the functional layers described above may be omitted in the carrier adjustment layers CA1 and CA2.

Figure 3:
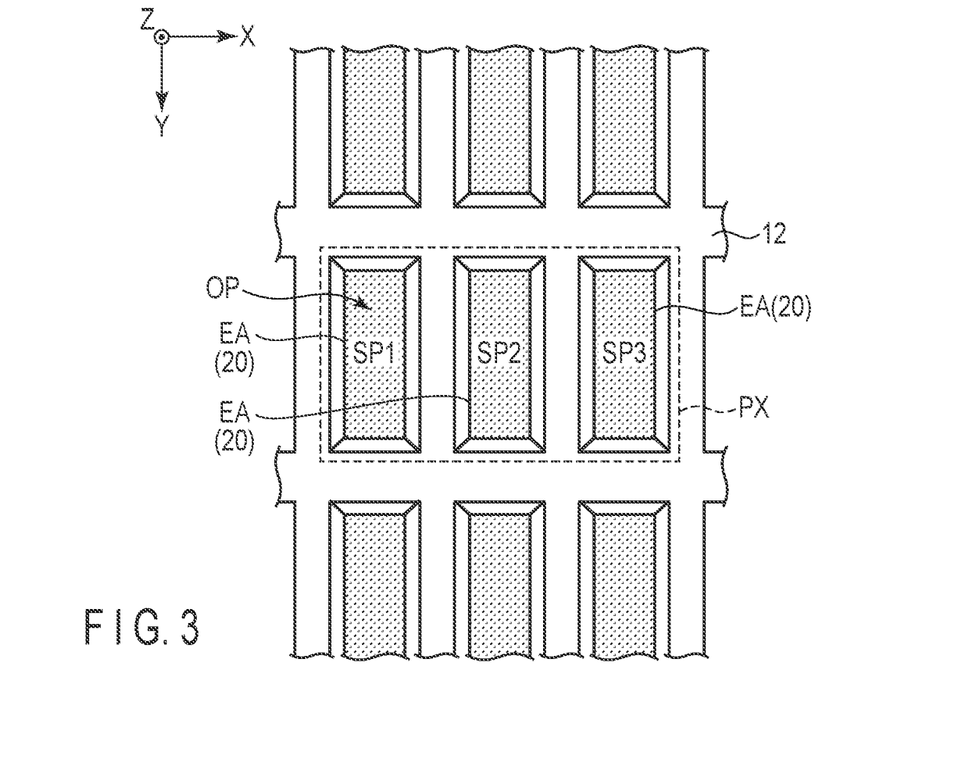
FIG. 3 is a plan view showing an example of a pixel PX shown in FIG. 1.

FIG. 3 is a plan view showing an example of the pixel PX shown in FIG. 1.

The subpixels SP1, SP2 and SP3 that constitute one pixel PX are each formed into a rectangular shape elongated along the second direction Y, and are aligned along the first direction X. The outer shape of the subpixels corresponds to the outer shape of the light-emitting area EA in the display element 20, but it is shown in a simplified way and therefore it does not necessarily reflect the actual shape. Here, it is assumed that the light-emitting area EA is formed into a rectangular shape with short sides extending along the first direction X and long sides extending along the second direction Y.

The insulating layer 12, which will be described in detail later, is formed into a grid pattern extending along the first and second directions X and Y in planar view, which surrounds each of the subpixels SP1, SP2 and SP3, or the display element 20 of each subpixel. The insulating layer 12 with such a configuration may be referred to as ribs, partitions, banks, etc. The light-emitting area EA is formed in each opening OP of the insulating layer 12 and corresponds to the region where the organic layer OR is interposed between the lower electrode E1 and the upper electrode E2.

For example, when the display elements 20 of the subpixels SP1, SP2, and SP3 are configured to emit light of colors different from each other, the first direction X corresponds to a direction in which subpixels of different display colors are aligned, and the second direction Y corresponds to a direction in which subpixels of the same display color are aligned. Alternatively, the subpixels of the same display color may be aligned along a diagonal direction different from the first direction X and the second direction Y.

Figure 4:
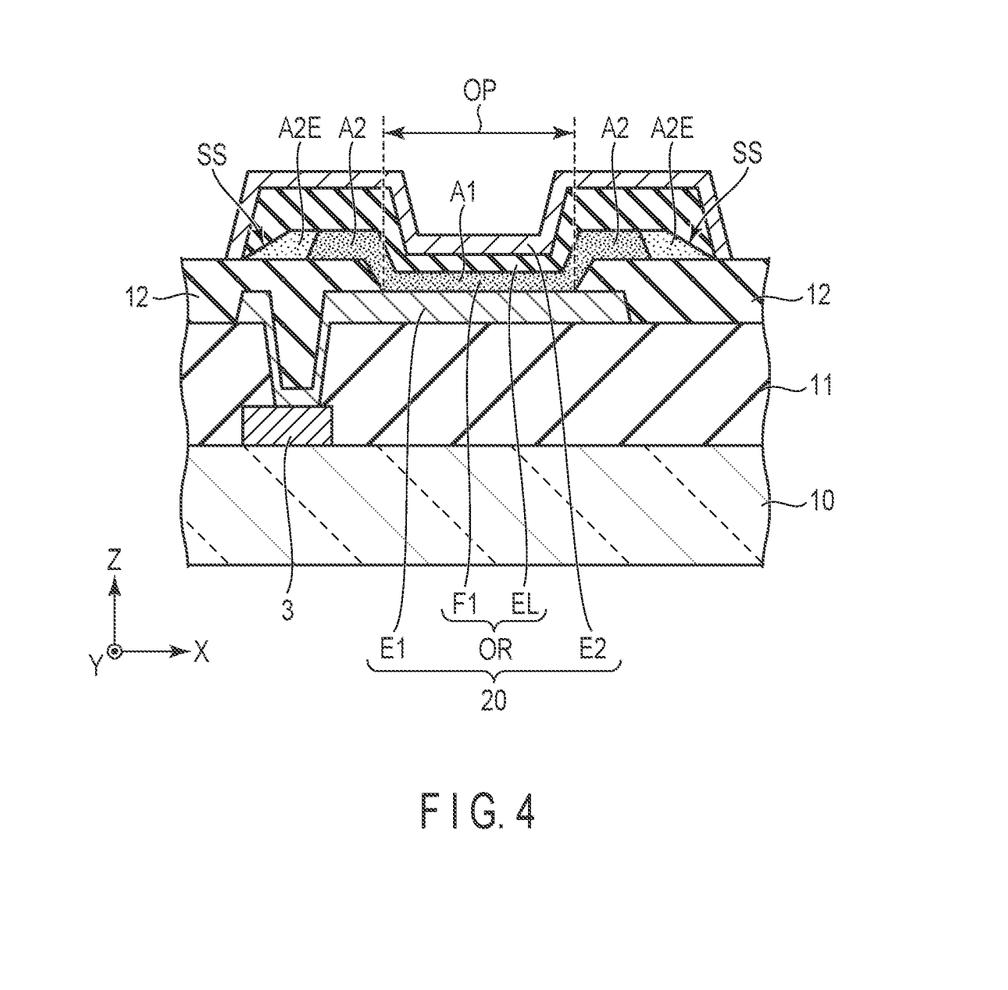
FIG. 4 is a cross-sectional view showing an example of the display element 20.

FIG. 4 is a cross-sectional view of an example of the display element 20.

The pixel circuit 1 shown in FIG. 1 is disposed on the base 10 and covered by an insulating layer 11. FIG. 4 illustrates a drive transistor 3 contained in the pixel circuit 1 in a simplified way. The insulating layer (first insulating layer) 11 corresponds to an underlying layer of the display element 20. The insulating layer (second insulating layer) 12 is disposed on insulating layer 11. The insulating layers 11 and 12 are, for example, organic insulating layers.

The lower electrode E1 is disposed on the insulating layer 11. The lower electrode E1 is an electrode provided for each subpixel or each display element, and is electrically connected to the drive transistor 3. The lower electrode E1 with such a configuration may be referred to as a pixel electrode, anode or the like.

The lower electrode E1 is, for example, a metal electrode formed of a metal material such as silver or aluminum. Note that the lower electrode E1 may be, for example, a transparent electrode formed of a transparent conductive material such as indium tin oxide (ITO) or indium zinc oxide (IZO). Further, the lower electrode E1 may as well be a stacked body of a transparent electrode and a metal electrode. For example, the lower electrode E1 may be configured as a stacked body consisting of a transparent electrode, a metal electrode and a transparent electrode stacked one on another in this order, or may be configured as a stacked body consisting of three or more layers. The lower electrode E1 may be configured to be different from other regions in a partial region. In the display device 20 of a top emission type, the lower electrode E1 includes a metal electrode as a reflective electrode.

The insulating layer 12 has an opening OP. The opening OP is a through hole formed in the region overlapping the lower electrode E1 and penetrating the insulating layer 12 to the lower electrode E1. The peripheral portion of the lower electrode E1 is covered by the insulating layer 12, and the central portion of the lower electrode E1 is exposed from the insulating layer 12 in the opening OP.

The organic layer OR includes a functional layer F1 and a light-emitting layer EL. The organic layer OR is disposed in the opening OP and covers at least part of the lower electrode E1 and at least part of the insulating layer 12. The functional layer F1 is at least one layer that constitutes the carrier adjustment layer CA1 shown in FIG. 2, and is, for example, the hole injection layer F11 or the carrier generation layer F13. Note that in FIG. 4, the other functional layers included in the organic layer OR are not shown.

The functional layer F1 includes a region (first region) A1 located between the lower electrode E1 and the light-emitting layer EL, and a region A2 located between the insulating layer 12 and the light-emitting layer EL. Of the region A2, the peripheral region (second region) A2E is a region including an end surface SS located directly above the insulating layer 12. The end surface SS is an inclined surface. The thickness in the region A2E along the third direction Z is less as the location is further on an outer side (further from the region A1).

The functional layer F1 is a mixed layer (co-deposited layer) containing a host material and a guest material. More specifically, the functional layer F1 is formed by doping the host material with the guest material. When the functional layer F1 is a hole injection layer or a carrier generation layer, the functional layer F1 contains a p-type dopant as the guest material. The dopant concentration of the guest material in the region A2E is lower than the dopant concentration of the guest material in the region A1. In other words, the dopant concentration of the guest material in the functional layer F1 has a concentration gradient that decreases as the location is further on an outer side. The functional layer F1 with such configuration is formed by co-depositing the host material and the guest material, as will be described below. Further, the functional layer F1 is covered by the light-emitting layer EL.

The upper electrode E2 covers the organic layer OR. The upper electrode E2 may be referred to as a common electrode, a counter electrode, a cathode or the like.

The upper electrode E2 is, for example, a semi-transmissive metal electrode formed of a metal material such as magnesium or silver. Note that the upper electrode E2 may be a transparent electrode formed of a transparent conductive material such as ITO or IZO. Further the upper electrode E2 may also be a stacked body of a transparent electrode and a metal electrode.

The upper electrode E2 may be configured to be different from other regions in a partial region. The upper electrode E2 is electrically connected to a power feed line disposed in the display area DA or a power feed line disposed on an outer side of the display area DA.

A portion of the organic layer OR that is located between the lower electrode E1 and the upper electrode E2 without interposing the insulating layer 12, can form the light-emitting region of the display element 20. For example, the thickness of the organic layer OR along the third direction Z is set as to match the peak wavelength of the emission spectrum in the light-emitting layer EL with the effective optical path length between the lower electrode E1 and the upper electrode E2. With this configuration, a microcavity structure for obtaining the resonance effect can be realized.

On the upper electrode E2, an optical adjustment layer to improve the light extraction efficiency and a sealing layer to protect the display element 20 from moisture, etc., are provided though they are not illustrated in the figure.

As described above, the functional layer F1, including the hole injection layer F11 and the carrier generation layer F13, which constitute the organic layer OR, are configured such that the dopant concentration of the guest material in the region A2E, which is the peripheral portion, is extremely low. As a result, the generation of carriers in the peripheral portion is suppressed. Thus, undesired current leakage between the peripheral portion and the upper electrode E2 is suppressed. Therefore, the degradation in performance of the display device 20 can be suppressed.

Figure 5:
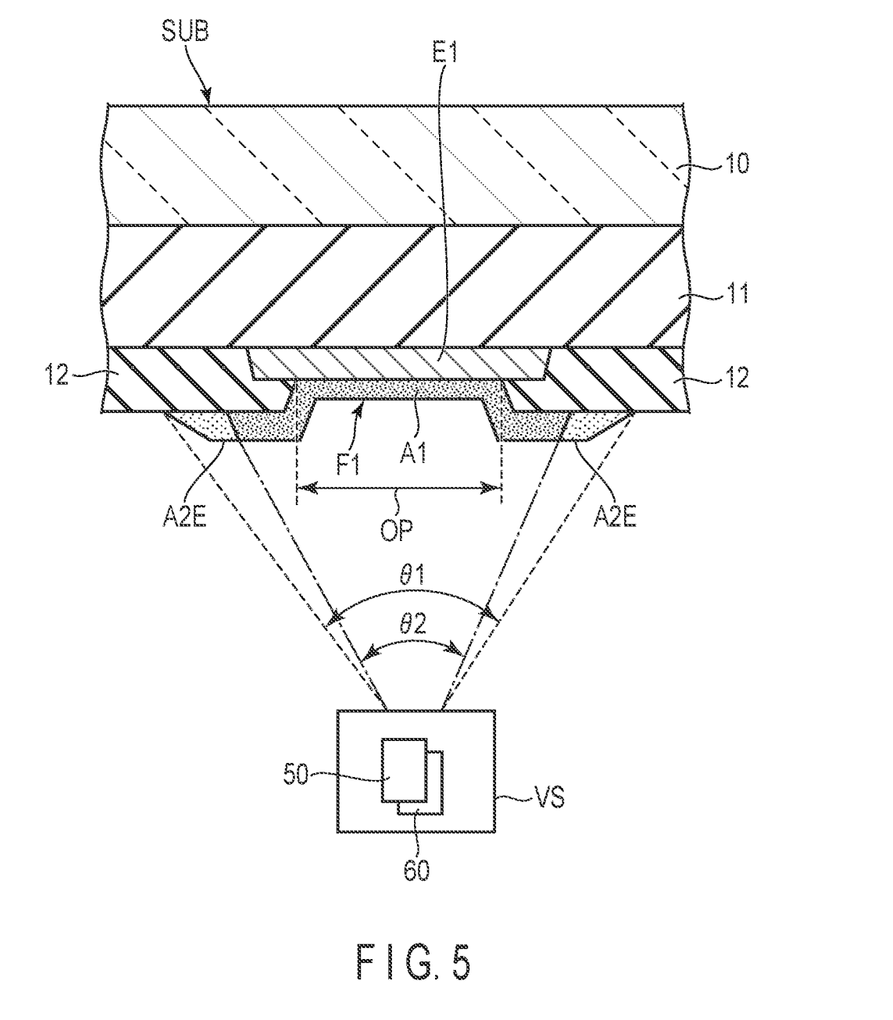
FIG. 5 is a diagram illustrating a method of manufacturing the display element 20 shown in FIG. 4.

FIG. 5 is a diagram illustrating an example of a method of manufacturing the display element 20 shown in FIG. 4.

First, a processing substrate SUB to be processed is prepared. The processing substrate SUB can be obtained by forming an insulating layer 11 above a base 10, then forming a lower electrode E1 on the insulating layer 11, and subsequently forming an insulating layer 12 including an opening OP overlapping the lower electrode E1.

The processing substrate SUB is then set such that the insulating layer 12 and the vapor deposition source VS face each other. Thereafter, each layer of the organic layer OR is formed by the vapor deposition method. The deposition of the organic layer OR is performed while the vapor deposition source VS moves relative to the processing substrate SUB. In other words, the vapor deposition source VS may move with respect to the fixed processing substrate SUB, or the processing substrate SUB may move with respect to the fixed vapor deposition source VS, or both the processing substrate SUB and the vapor deposition source VS may move with respect to each other. For example, in the layout of subpixels shown in FIG. 3, when the display color of the subpixels aligned along the second direction Y is the same, the movement direction is set to the second direction Y. When the display color of the subpixels aligned along a diagonal direction different from the first direction X and the second direction Y is the same, the movement direction is set to the diagonal direction.

FIG. 5 shows a process step of forming the functional layer F1 of the organic layer OR. The vapor deposition source VS comprises a crucible 50 that houses the host material and a crucible 60 that houses the guest material (p-type dopant). These crucibles 50 and 60 are heated by a heating mechanism. The vapor of the host material generated by heating the crucible 50 is emitted at a first radiation angle $\theta 1$. The vapor of the guest material generated by heating the crucible 60 is emitted at a second radiation angle $\theta 2$. Here, the second radiation angle $\theta 2$ is less than the first radiation angle $\theta 1$ ($\theta 1 > \theta 2$).

With this configuration, the host material and the guest material are mixed at an appropriate ratio at substantially the front of the vapor deposition source VS, and the mixing ratio of the guest material to the host material decreases as the location is further on an outer side. As a result, the region A1 is formed as a region where the mixture of the host material and the guest material is deposited, and the region A2E is formed as a region where substantially no guest material is contained and substantially only the host material is deposited.

Figure 6:
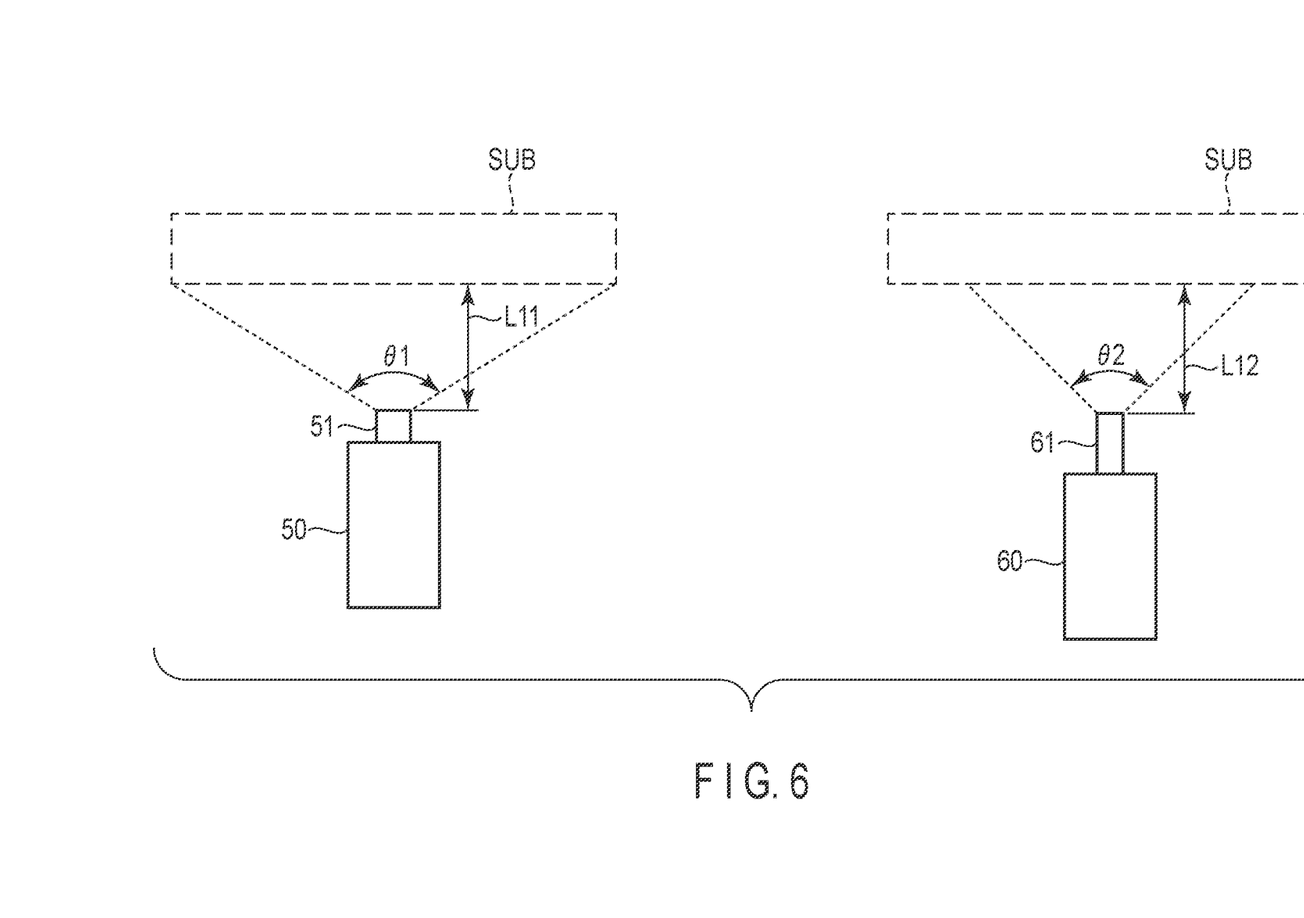
FIG. 6 is a diagram illustrating a method of controlling a radiation angle.

FIG. 6 is a diagram illustrating one method of controlling the radiation angle.

In the example shown in FIG. 6, the radiation angle (or the directivity of the vapor) is controlled by the shape of the nozzle connected to the crucible. The shape of the nozzle 51 connected to the crucible 50 is different from the shape of the nozzle 61 connected to the crucible 60. Here, the nozzle 51 is thicker and shorter than the nozzle 61. When a distance L11 between the nozzle 51 and the processing substrate SUB is the same as a distance L12 between the nozzle 61 and the processing substrate SUB, the first radiation angle $\theta 1$ of the vapor of the host material emitted from the nozzle 51 is greater than the second radiation angle $\theta 2$ of the vapor of the guest material emitted from the nozzle 61 ($\theta 1 > \theta 2$). That is, the vapor of the host material emitted from nozzle 51 spreads easily (lower directivity). On the other hand, the vapor of the guest material emitted from nozzle 61 does not easily spread (high directivity).

Figure 7:
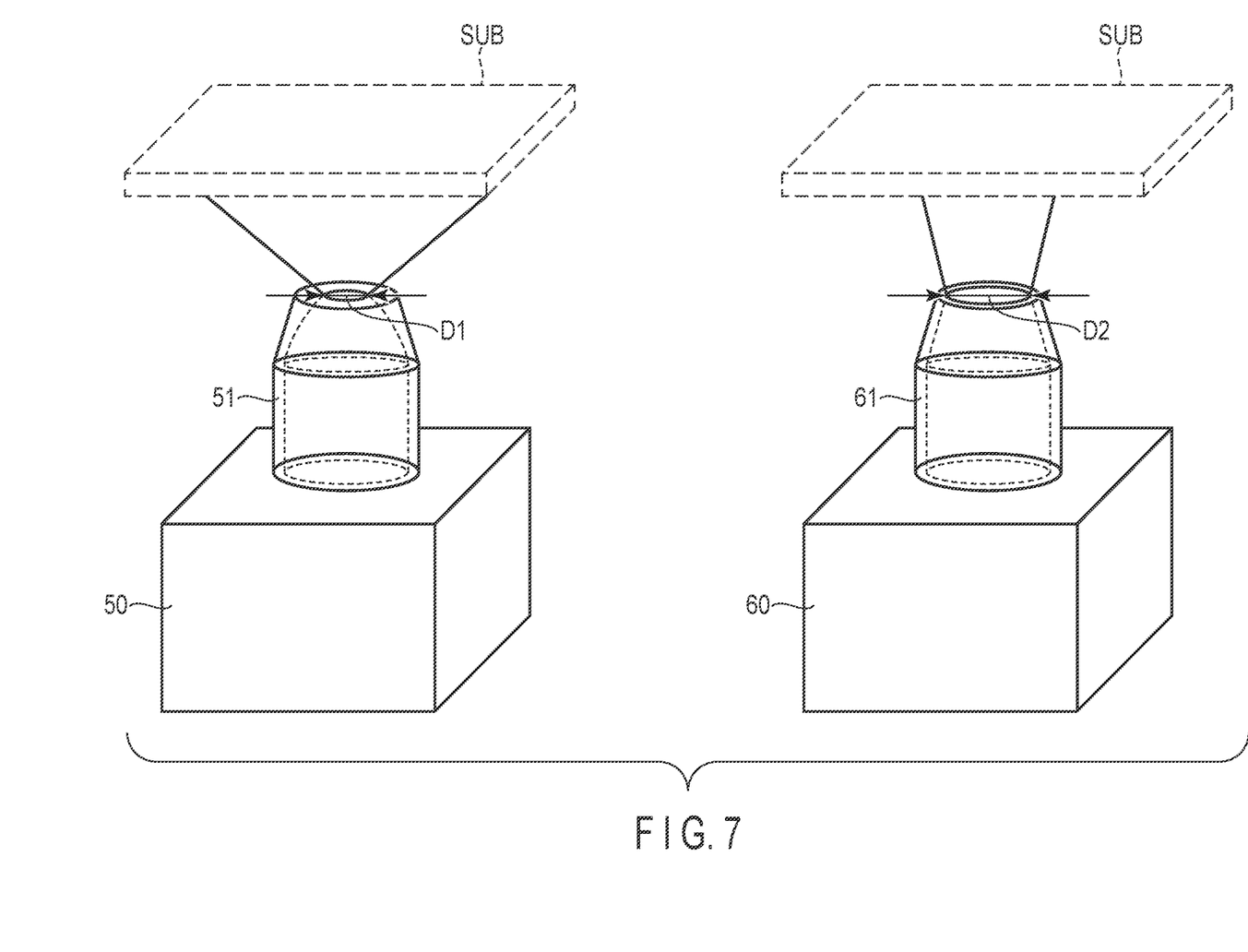
FIG. 7 is a diagram illustrating another method of controlling the radiation angle.

FIG. 7 is a diagram illustrating another method of controlling the radiation angle.

In the example illustrated in FIG. 7 as well, the shape of the nozzle 51 is different from that of the nozzle 61. Here, an opening diameter D1 of the nozzle 51 is less than an opening diameter D2 of the nozzle 61 (D1<D2). In such an example, the vapor of the host material emitted from nozzle 51 spreads easily, while the vapor of the guest material emitted from nozzle 61 does not easily spread.

Figure 8:
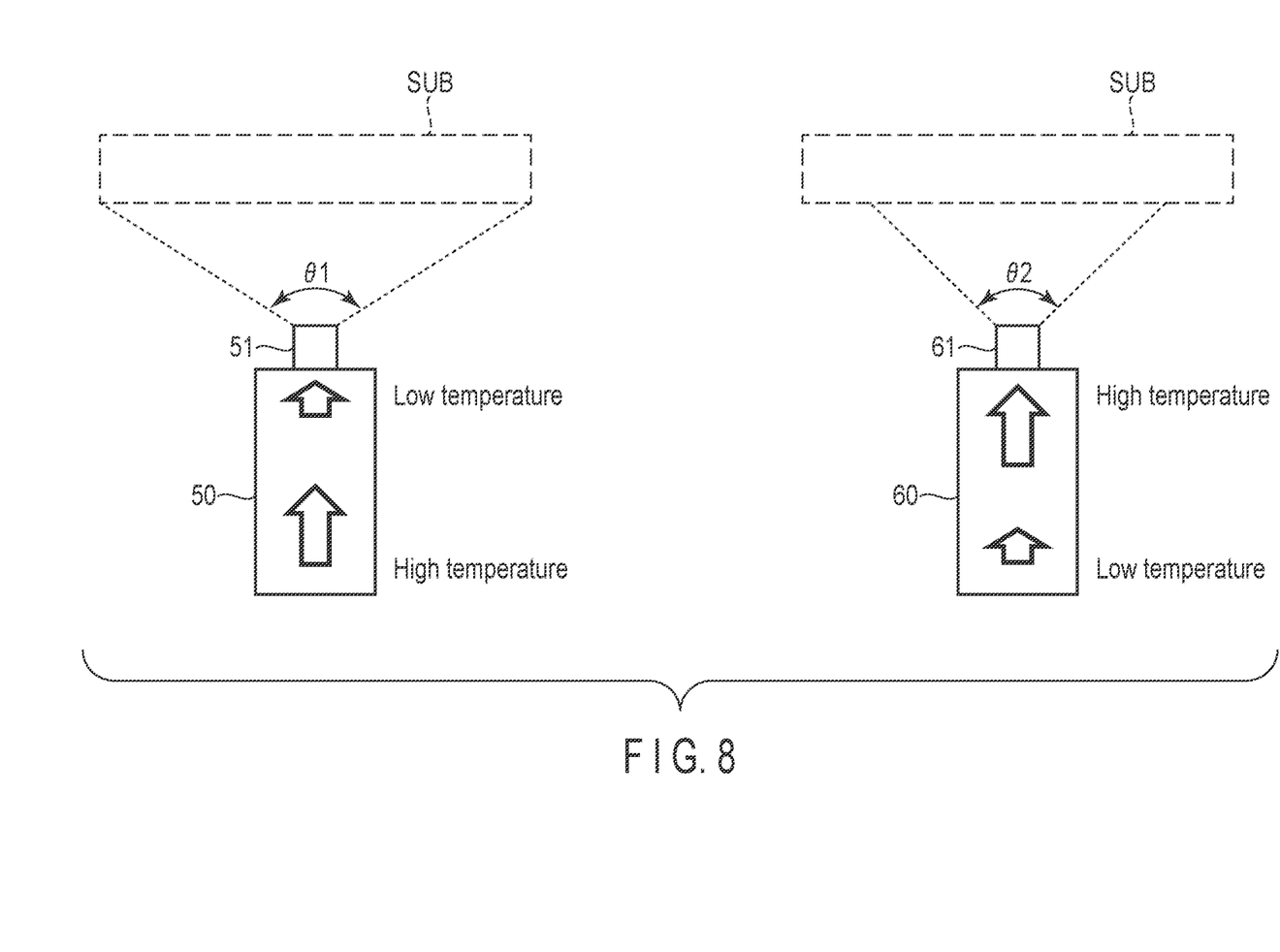
FIG. 8 is a diagram illustrating still another method of controlling the radiation angle.

FIG. 8 is a diagram illustrating still another method of controlling the radiation angle.

In the example illustrated in FIG. 8, the temperature distribution of the crucible 50 which heats the host material is different from that of the crucible 60 which heats the guest material. For example, the heating temperature in a bottom side of the crucible 50 is set higher than the heating temperature in a nozzle side, and the heating temperature in the bottom side of the crucible 60 is set lower than that of the nozzle side. Thus, by adjusting the temperature distributions of the crucibles, the radiation angles of the vapor can be controlled. In the example illustrated in FIG. 8, the vapor of the host material emitted from nozzle 51 spreads easily, while the vapor of the guest material emitted from the nozzle 61 does not easily spread.

Note that the methods illustrated in FIGS. 6 to 8 can be combined in any combination as appropriate.

Figure 9:
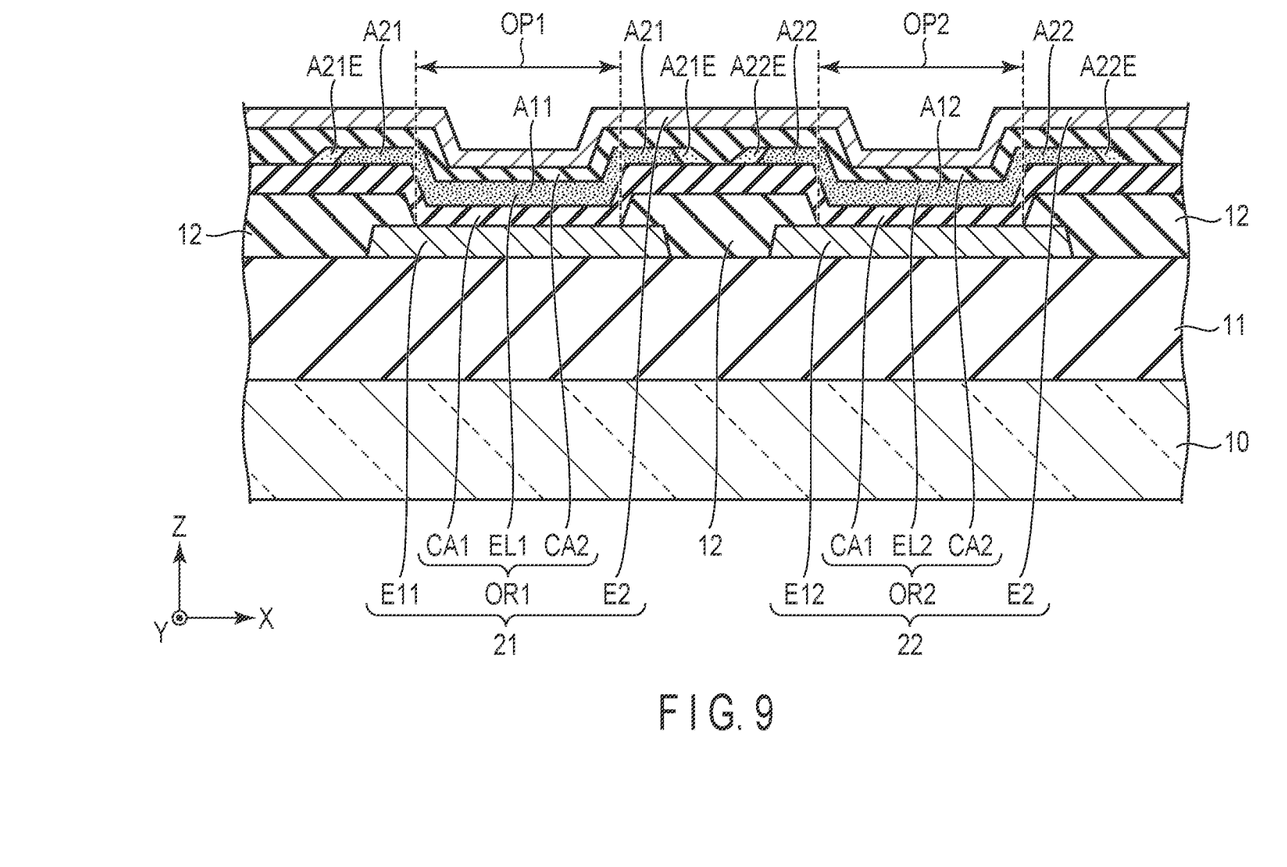
FIG. 9 is a cross-sectional view showing another example of the display element.

FIG. 9 is a cross-sectional view of another example of the display device.

The example shown in FIG. 9 is different from that of FIG. 4 in that the dopant concentration of the light-emitting material as the guest material in the light-emitting layer EL has a concentration gradient.

Here, two display elements adjacent to each other in the first direction X will be focused. For convenience, the display element located on the left side of the figure is referred to as a display element 21, and the display element located on the right side is referred to as a display element 22.

The display element 21 comprises a lower electrode (first lower electrode) E11, an organic layer (first organic layer) OR1 and an upper electrode E2. The organic layer OR1 includes carrier adjustment layers CA1 and CA2 and a light-emitting layer EL1.

The display element 22 comprises a lower electrode (second lower electrode) E12, an organic layer (second organic layer) OR2 and an upper electrode E2. The organic layer OR2 includes carrier adjustment layers CA1 and CA2 and a light-emitting layer EL2.

The carrier adjustment layers CA1 and CA2 and the upper electrode E2 are common layers formed continuously over the display elements 21 and 22. The light-emitting layer EL1 is separated from the light-emitting layer EL2.

The light-emitting layer EL1 includes a region (first region) A11 located between the lower electrode E11 and the upper electrode E2, and a region A21 located between the insulating layer 12 and the upper electrode E2. Of the region A21, a peripheral region (second region) A21E thereof, is located directly above the insulating layer 12, and its thickness along the third direction Z decreases as the location is further on an outer side (further away from the region A11).

The light-emitting layer EL2 includes a region (first region) A12 located between the lower electrode E12 and the upper electrode E2, and a region A22 located between the insulating layer 12 and the upper electrode E2. Of the region A22, a peripheral region (second region) A22E is located directly above the insulating layer 12, and its thickness along the third direction Z decreases as the location is further on an outer side (further away from the region A12).

The light-emitting layers EL1 and EL2 are mixed layers (co-deposited layers) each containing a host material and a light-emitting material as a guest material. That is, the light-emitting layers EL1 and EL2 are formed by doping the host material with the light-emitting material. The light-emitting material contained in the light-emitting layer EL1 may be the same as that of the light-emitting material contained in the light-emitting layer EL2, or they may be different from each other. In other words, the color of the light emitted from the light-emitting layer EL1 may be the same as that of the light-emitting layer EL2 or may be different from that of the light-emitting layer EL2. Each of the light-emitting layers EL1 and EL2 is formed by co-depositing the host material and the light-emitting material.

The dopant concentration of the light-emitting material in the region A21E is higher than the dopant concentration of the light-emitting material in the region A11. That is, the dopant concentration of the light-emitting material in the light-emitting layer EL1 has a concentration gradient that increases as the location is further on the outer side.

Similarly, the dopant concentration of the light-emitting material in the region A22E is higher than that of the light-emitting material in the region A12. That is, the dopant concentration of the light-emitting material in the light-emitting layer EL2 has a concentration gradient that increases as the location is further on the outer side. The regions A21E and A22E are covered by the carrier adjustment layer CA2, and the carrier adjustment layer CA2 is in contact with the carrier adjustment layer CA1 between the region A21E and the region A22E, which are adjacent to each other.

Thus, when the carrier adjustment layer CA1 is formed as a common layer across the adjacent display elements, for example, carriers that migrate from the display element 21 to the display element 22 via the carrier adjustment layer CA1 may recombine with each other in the light-emitting layer EL2, thereby possibly causing undesired light emission.

In order to avoid this, as described above, a region having an extremely high dopant concentration of the light-emitting material is provided in the peripheral portion of the light-emitting layer. For example, in the light-emitting layer EL1, the dopant concentration of the light-emitting material is higher in the region A21E than in the region A11. The threshold voltage of the region A21E is lower than that of the region A11, but the luminous efficiency of the region A21E is lower than that of the region A11. Therefore, in the region A21E, the recombination of carriers migrating from the display device 21 towards the display device 22 is promoted, thus consuming carriers. As a result, the number of carriers reaching the display element 22 from the display element 21 is reduced, and undesired light emission in the light-emitting layer EL2 is suppressed.

When the emission color of the display element 21 is different from that of the display element 22, the undesired emission of the adjacent display elements is suppressed and therefore the desired color chromaticity can be obtained.

Figure 10:
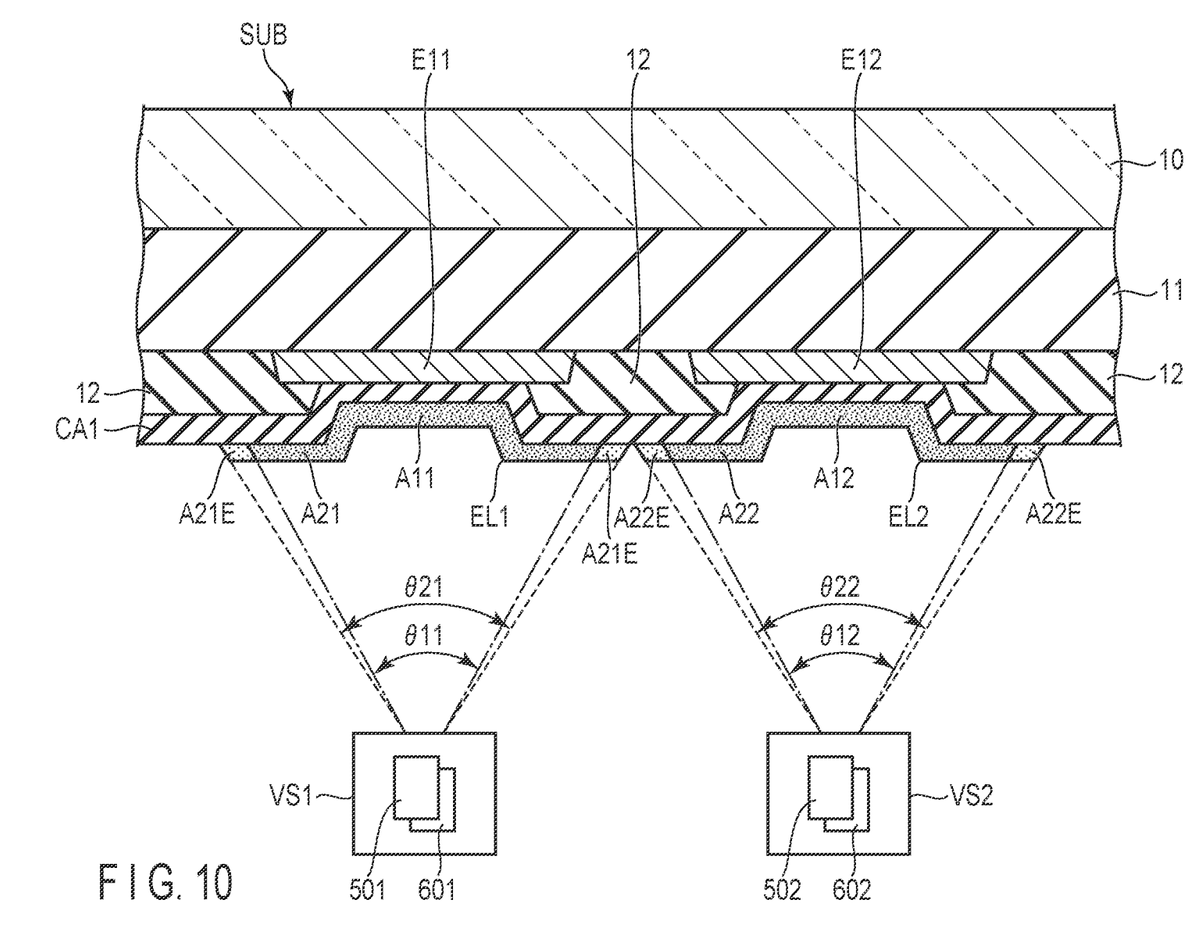
FIG. 10 is a diagram illustrating a method of manufacturing display elements 21 and 22 shown in FIG. 9.

FIG. 10 is a diagram illustrating an example of a method of manufacturing the display elements 21 and 22 shown in FIG. 9.

First, a processing substrate SUB to be processed is prepared. Then, the processing substrate SUB is set up such that the insulating layer 12 and the vapor deposition sources VS1 and VS2 face each other. Thereafter, the layers which constitutes the organic layer OR are formed by the vapor deposition method.

FIG. 10 shows a processing step of forming the light-emitting layers EL1 and EL2 of the organic layers OR after forming the carrier adjustment layer CA1. The vapor deposition source VS1 comprises a crucible 501 that houses a host material and a crucible 601 that houses a first light-emitting material as a guest material. The vapor deposition source VS2 comprises a crucible 502 that houses a host material and a crucible 602 that houses a second light-emitting material as a guest material.

The vapor of the host material generated by heating the crucible 501 is emitted at a radiation angle $\theta 11$. The vapor of the first light-emitting material generated by heating the crucible 601 is emitted at a radiation angle $\theta 21$. Here, the radiation angle $\theta 21$ is greater than the radiation angle $\theta 11$ ($\theta 21 > \theta 11$).

Therefore, in substantial front of the vapor deposition source VS1, the host material and the first light-emitting material are mixed at an appropriate ratio, and the mixing ratio of the first light-emitting material to the host material decreases as the location is further on the outer side. Thus, the region A11 is formed as a region where a mixture of the host material and the first light-emitting material is deposited, and the region A21E is formed as a region where, substantially, the host material is not contained and only the first light-emitting material is deposited.

Similarly, the vapor of the host material generated by heating the crucible 502 is emitted at a radiation angle $\theta 12$. Further, the vapor of the second light-emitting material generated by heating the crucible 602 is emitted at a radiation angle $\theta 22$. Here, the radiation angle $\theta 22$ is greater than the radiation angle $\theta 12$ ($\theta 22 > \theta 12$).

Therefore, in substantial front of the vapor deposition source VS2, the host material and the second light-emitting material are mixed at an appropriate ratio, and the mixing ratio of the second light-emitting material to the host material decreases as the location is further on the outer side. Thus, the region A12 is formed as a region where a mixture of the host material and the second light-emitting material is deposited, and the region A22E is formed as a region where, substantially, the host material is not contained and only the second light-emitting material is deposited. As the vapor deposition sources VS1 and VS2, at least one of configurations shown in FIGS. 6 to 8 can be applied.

According to the embodiments described above, it is possible to provide a display device that can suppress the degradation in performance of the display element and a method of manufacturing such a display device.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A method for manufacturing a display device comprising:
   forming a lower electrode;
   forming an organic layer on the lower electrode; and
   forming an upper electrode on the organic layer,
   wherein the forming the organic layer includes forming a functional layer, and
   the forming the functional layer includes co-depositing a host material emitted at a first radiation angle and a guest material emitted at a second radiation angle smaller than the first radiation angle.

2. The method of claim 1, wherein
   a p-type dopant is deposited as the guest material.

3. The method of claim 1, wherein
   a shape of a nozzle which emits the host material is different from a shape of a nozzle which emits the guest material.

4. The method of claim 1, wherein
   a temperature distribution of a crucible for heating the host material is different from a temperature distribution of a crucible for heating the guest material.

5. A method for manufacturing a display device comprising:
   forming a lower electrode;
   forming an organic layer on the lower electrode; and
   forming an upper electrode on the organic layer,
   wherein the forming the organic layer includes forming a light-emitting layer, and
   the forming the light-emitting layer includes co-depositing a host material emitted at a first radiation angle and a guest material emitted at a second radiation angle greater than the first radiation angle.

6. The method of claim 5, wherein
   a shape of a nozzle which emits the host material is different from a shape of a nozzle which emits the guest material.

7. The method of claim 5, wherein
   a temperature distribution of a crucible for heating the host material is different from a temperature distribution of a crucible for heating the guest material.

* * * * *